(12) United States Patent
Kanemitsu (10) Patent No.: US 8,497,671 B2
(45) Date of Patent: Jul. 30, 2013

(54) LOAD DRIVING DEVICE WITH OVER CURRENT PROTECTION

(75) Inventor: Ryosuke Kanemitsu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 78 days.

(21) Appl. No.: 13/154,747

(22) Filed: Jun. 7, 2011

(65) Prior Publication Data

US 2011/0298443 A1  Dec. 8, 2011

(30) Foreign Application Priority Data

Jun. 7, 2010 (JP) .................................. 2010-130315

(51) Int. Cl.
*G05F 3/04* (2006.01)

(52) U.S. Cl.
USPC ........... 323/312; 323/311; 323/313; 323/314; 323/315; 323/316; 323/317; 327/538; 327/541; 361/93.1; 361/93.9

(58) Field of Classification Search
USPC ................. 323/220, 222–226, 232, 299–303, 323/355, 363; 361/91
See application file for complete search history.

(56) References Cited

U.S. PATENT DOCUMENTS

| | | | |
|---|---|---|---|
| 5,103,158 A * | 4/1992 | Cho et al. | 323/314 |
| 5,617,285 A * | 4/1997 | Zitta | 361/92 |
| 5,670,867 A * | 9/1997 | Mitsuda | 323/312 |
| 5,952,856 A * | 9/1999 | Horiguchi et al. | 327/110 |
| 6,377,109 B1 * | 4/2002 | Yama | 327/423 |
| 7,061,308 B2 * | 6/2006 | Abadeer et al. | 327/543 |
| 7,492,560 B2 * | 2/2009 | Hussein et al. | 361/91.1 |
| 7,573,300 B2 * | 8/2009 | Abadeer et al. | 326/95 |
| 7,573,689 B2 * | 8/2009 | Hojo | 361/93.1 |
| 7,598,715 B1 * | 10/2009 | Hariman et al. | 323/271 |
| 7,609,015 B2 * | 10/2009 | Okui | 318/400.21 |
| 7,622,904 B2 * | 11/2009 | Sutardja et al. | 323/282 |
| 7,750,611 B2 * | 7/2010 | Lee | 323/274 |
| 7,839,610 B2 * | 11/2010 | Yamamoto et al. | 361/30 |
| 7,843,675 B2 * | 11/2010 | Hirata | 361/93.1 |
| 7,933,103 B2 * | 4/2011 | Ohshima | 361/93.1 |
| 7,948,729 B2 * | 5/2011 | Zhang et al. | 361/93.9 |
| 8,325,451 B2 * | 12/2012 | Mitsuda | 361/93.1 |
| 8,334,681 B2 * | 12/2012 | Arigliano | 323/282 |
| 2008/0186006 A1 * | 8/2008 | Chapuis | 323/283 |

FOREIGN PATENT DOCUMENTS

| | | |
|---|---|---|
| JP | 04-134271 | 5/1992 |
| JP | 06-030523 | 2/1994 |
| JP | 2004-247834 | 9/2004 |
| JP | 2009-011112 | 1/2009 |

* cited by examiner

*Primary Examiner* — Nguyen Tran
*Assistant Examiner* — Kyle J Moody
(74) *Attorney, Agent, or Firm* — Fish & Richardson P.C.

(57) ABSTRACT

The load driving device disclosed in the specification includes a controller to generate a first control signal based on an input signal, a first output transistor to supply an output current to a load according to the first control signal, a first dividing circuit to output a first divided voltage by dividing a voltage across a first primary electrode and a second primary electrode of the first output transistor by a first transistor and a second transistor connected in serial, a first voltage generating circuit to output a first reference voltage, and a first comparator to supply a first over current detection signal to the controller based on the first reference voltage and the first divided voltage.

20 Claims, 8 Drawing Sheets

LOAD DRIVING DEVICE WITH OVER CURRENT PROTECTION

CROSS-REFERENCE TO RELATED APPLICATIONS

This application claims the benefit of priority of Japanese patent application No. 2010-130315 (filing date: 2010 Jun. 7), which is incorporated herein by reference in its entirety.

BACKGROUND OF THE INVENTION

1. Field of the Invention

This disclosure relates to a load driving device and an electrical device using the same, and especially relates to a technique to detect a current by a transistor.

2. Description of Related Art

Conventionally, a technique is known to detect an over current flowing through an output transistor of the load driving device by a detection resistance and to detect a voltage generated across the detection resistance. Also, a technique is known which does not use a resistor and uses another transistor from an output transistor for the detection.

In the patent document 1 (Japanese patent publication No. 2009-11112), a construction to detect an over current is illustrated. The construction includes an output current detection resistor utilizing a parasitic resistance of a metal wire connected to the power transistor, and a pair of bipolar transistors Q1 and Q2. The over current detection is performed by a first current mirror circuit to a connection node of which a voltage across the output current detection resistance is applied, a second current mirror circuit to maintain collector currents of a pair of transistors to a predetermined mirror ratio, and a switch element to be turned ON/OFF according to a collector voltage of the transistor Q2.

In the patent document 2 (Japanese patent publication No. H4-134271), a technique is proposed to detect an over current as a function to detect an over current circuit to detect a current flowing through an output terminal. The technique is achieved by a comparator to compare a reference voltage and a voltage of the output terminal provided between the output transistor and the load. The reference voltage is generated by a comparing transistor and a constant current power source. Regarding the comparing transistor and the output transistor, each size is different though each characteristic is the same.

In the patent document 3 (Japanese patent publication No. 2004-247834), a construction is disclosed to detect an over current by comparing a A/D converted source-drain voltage (i.e., a voltage across a source and a drain) of a PMOS transistor of an output stage with an over current determination reference voltage.

In the patent document 4 (Japanese patent publication No. H6-30523), an over current protection is performed based on a control for a gate voltage potential of a switch. The gate voltage potential is controlled by a transistor. A conduction level of the transistor is controlled based on a source-drain voltage potential (i.e., a voltage across a source and a drain) of the switch which cuts off a power source from a motor driver.

As a resistance for the over current detection is realized by the wire resistance component parasitic to a metal wire, the patent document 1 has a problem of an increase of a chip cost.

A voltage almost equals to an output voltage is applied to an input terminal of the comparator, the over current protection circuit of the patent document 2 is not suitable for circumstance which deals with a high voltage.

Though an over current detection is performed based on a comparison between a source-drain voltage with a reference voltage, there is a problem in the patent document 3 that a circuit construction is complicated because of using a subtraction circuit for calculating the source-drain voltage.

As using a resistance or a capacitor to construct a circuit for detecting the source-drain voltage and cutting off the over current, the patent document 4 has a problem of an increase of a circuit scale.

SUMMARY OF THE INVENTION

In consideration of the above, a problem to be solved by the disclosure is to provide a load driving device which has an over current detection circuit and a protection circuit that can detect an overcurrent with a comparatively simple and small-scale construction, without using a resistor for detection or a wire resistor of aluminum wire and that can be used even in a circumstance where a high voltage is dealt with, and to provide an electric apparatus using such a load driving device.

To achieve the aforementioned purpose, the load driving device disclosed in the specification includes a controller to generate a first control signal based on an input signal, a first output transistor to supply an output current to a load according to the first control signal, a first dividing circuit to output a first divided voltage by dividing a voltage across a first primary electrode and a second primary electrode of the first output transistor by a first transistor and a second transistor connected in series, a first voltage generating circuit to output a first reference voltage, and a first comparator to supply a first over current detection signal to the controller based on the first reference voltage and the first divided voltage.

Other features of the disclosure, elements, steps, advantages, and characteristics will be apparent from the following description and the drawings and the claims.

DETAILED DESCRIPTION OF PREFERRED EMBODIMENTS

<A First Implementation>

Figure 1:
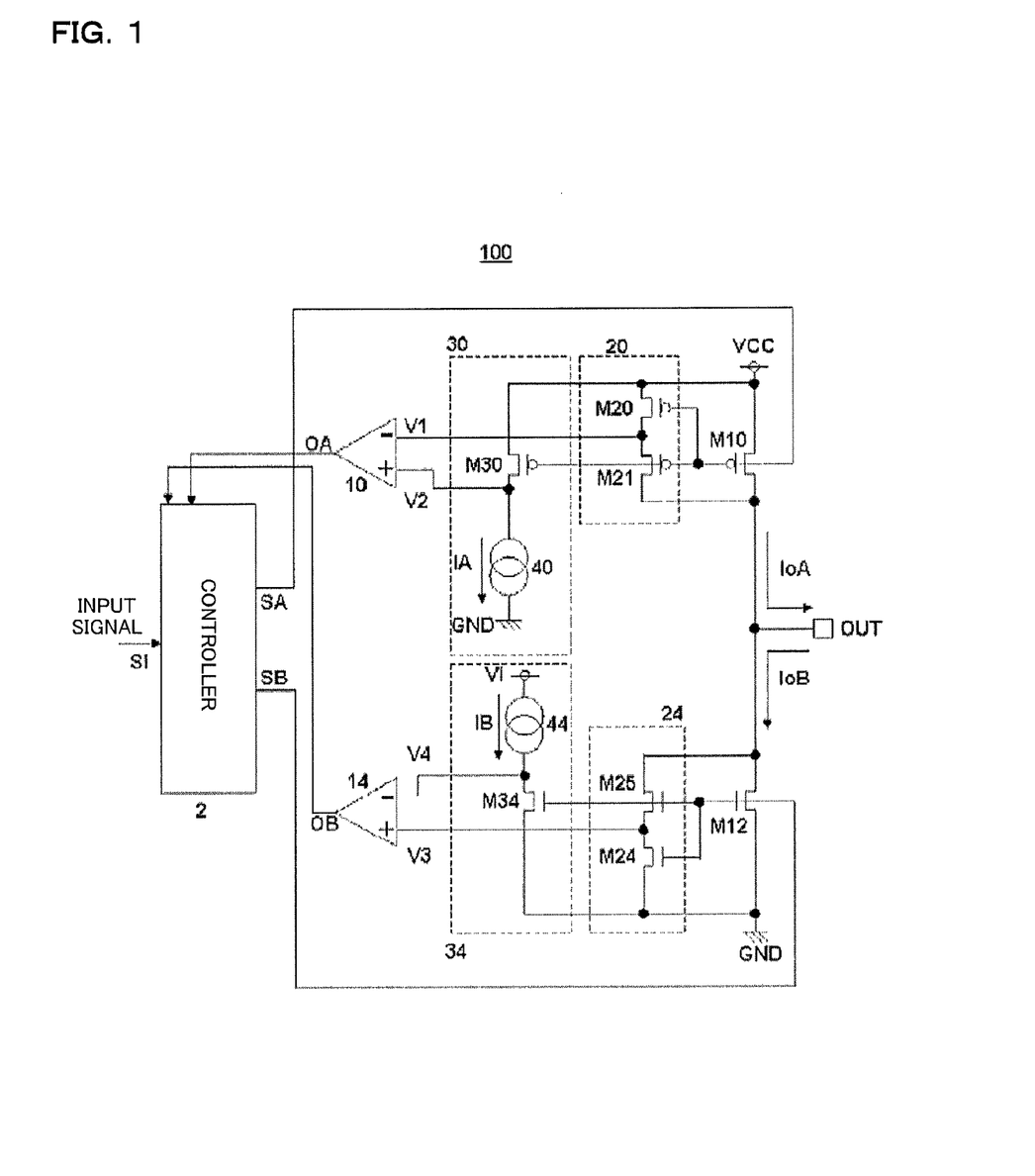
FIG. 1 is a circuit diagram illustrating a first implementation of the load driving device in accordance with the disclosure.

FIG. 1 is a circuit construction illustrating an implementation example of the load driving device 100 using the over current protection circuit in accordance with the disclosure.

The load driving device 100 of the first implementation includes power MOS transistors M10 and M12 which are equivalent to output transistors, a controller 2, dividing circuits 20 and 24, the voltage generating circuits 30 and 34, and comparators 10 and 14.

The controller 2 provides control signals SA and SB to each gate of the power MOS transistors M10 an M12, based on a provided signal SI generated at an external device like a microcomputer, for example. Furthermore, the controller 2 supplies the control signal SA to gates of MOS transistors M20 and M21 which construct the dividing circuit 20. The controller 2 also supplies the control signal SA to a gate of the MOS transistor M30 which constructs the voltage generating circuit 30.

Likewise, the control signal SB is supplied to a gate of a MOS transistors M24 and M25 which construct the dividing circuit 24, and also supplied to a gate of a MOS transistor M34 which constructs the voltage generating circuit 34.

Each source and drain of the MOS transistor M20 of the dividing circuit 20 is connected to a source of the power MOS transistor M10 and a source of the MOS transistor M21. A drain of the MOS transistor M21 is connected to a drain of the power MOS transistor M10. A voltage potential of a connection node between the MOS transistors M20 and the MOS transistor M21 is equivalent to a divided voltage V1. The voltage V1 is a divided voltage by dividing a voltage across the drain-source of the power MOS transistor M10 with each ON-resistance of the MOS transistors M20 and M21.

Likewise, the dividing circuit 24 provided for the power MOS transistor M12 side also generates a divided voltage V3 to a connection node between the MOS transistor M24 and the MOS transistor M25 by dividing a voltage across the drain-source of the power MOS transistor M12 with the MOS transistors M24 and M25.

The voltage generating circuit 30 includes a MOS transistor M30 and a constant current source 40 connected to a drain of the MOS transistor M30. This construction generates the reference voltage V2 to a connection node between the MOS transistor M30 and the constant current source 40.

Likewise, the voltage generating circuit 34 provided for the power MOS transistor M12 side also includes a MOS transistor M34 and a constant current source 44 connected to a drain of the MOS transistor M34. This construction generates a reference voltage V4 to a connection node between the MOS transistor M34 and the constant current source 44.

The divided voltage V1 and the reference voltage V2 generated at the power MOS transistor M10 side are provided to the comparator 10. Thus, the comparator 10 provides an over current detection signal OA according to a comparison result between the divided voltage V1 and the reference voltage V2. For example, a logic of the over current detection signal OA can be defined as a high level, based on a circuit construction which determines as an over current detection if the divided voltage V1 becomes lower than the reference voltage V2.

Likewise, the divided voltage V3 and the reference voltage V4 generated at the power MOS transistor M12 side is provided to a comparator 14 provided to the power MOS transistor M12 side. Likewise, the comparator 14 provides the over current detection signal OB according to a comparison result between the divided voltage V3 and the reference voltage V4. For example, if the circuit construction determines as the over current detection if the divided voltage V3 becomes higher than the reference voltage V4, a logic of the over current output signal OB can be defined as a high level.

With respect to the load driving device 100, based on a feedback of the over current detection signals OA and OB to the controller 2, the controller 2 controls the control signals SA and SB to turn OFF the power MOS transistors M10 and M12 regardless of the input signal SI, if at least one of the power MOS transistors M10 and M12 detects the over current.

A concrete operation of the first implementation in FIG. 1 is described below. The controller 2 receives the input signal SI and generates the control signals SA and SB supplied to the power MOS transistors M10 and M12. In this case, if either one of the power MOS transistors M10 and M12 is turned ON, another one is supposed to be turned OFF. For example, an explanation in case of the power MOS transistor M10 is turned ON and the power MOS transistor M12 is turned OFF is described below. As the power MOS transistor M10 is a PMOS transistor, a logic level to turn ON the transistor is a low level. On the other hand, as the power MOS transistor M12 is a NMOS transistor, a logic level supplied to the transistor is a low level. Furthermore, if the controller turns ON the power MOS transistor M12 and turns OFF the power MOS transistor M10, a logic level of the control signal SA is a high level, and a logic level of the control signal SB is a high level.

Based on the control signal SA and SB provided from the controller 2, when logic levels to turn ON the power MOS transistor M10 and M12 are supplied, a divided voltage based on a generated voltage at the power MOS transistors M10 and M12 is provided to the comparator. Then, the over current protection function performs based on the comparison result between the divided voltage and the reference voltage. The power MOS transistor M10 side is used for an explanation as below, for example. If an ON-resistance of the power MOS transistor M10 is Rm10 and a current flowing from the power MOS transistor M10 to the terminal OUT is IoA, a voltage generated across the drain-source of the power MOS transistor M10 equals to Rm10×IoA.

At this point, the divided voltage V1 is calculated from the voltage. If ON-resistances of the MOS transistor M20 and M21 are Rm20 and Rm21 respectively, and if Rm20≈Rm21, the divided voltage V1 is represented as the equation (1) below.

$$V1 = Rm10 \times IoA/2 \quad (1)$$

Besides, if an ON-resistance of the MOS transistor M30 is Rm30 and the current flowing from the constant current source 40 is IA, the reference voltage V2 is represented as the equation (2) below.

$$V2 = Rm30 \times IA \quad (2)$$

Figure 2A:
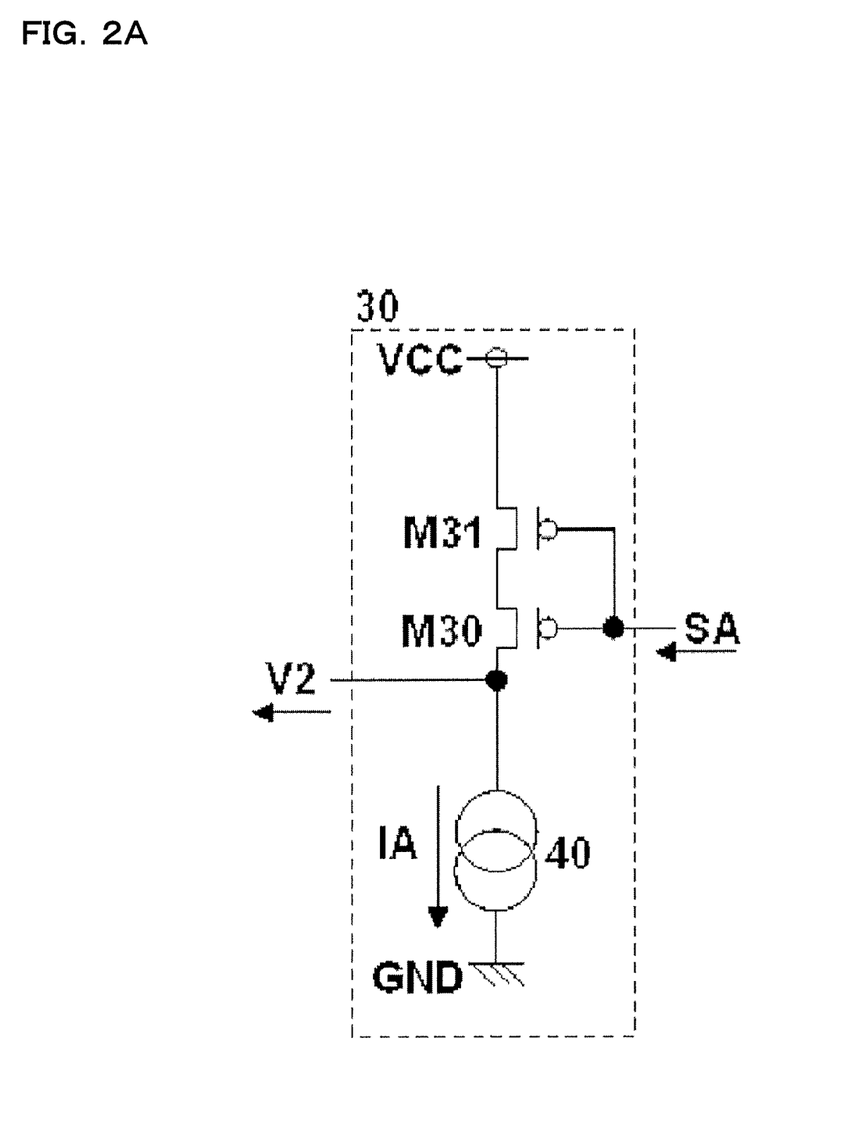
FIG. 2A is a first construction example of the voltage generating circuit of the load driving device in accordance with the disclosure.

Different from a circuit construction using a single MOS transistor M30 to realize the ON-resistor Rm30 of the voltage generating circuit 30 of the first implementation, FIG. 2A illustrates the voltage generating circuit 30. The voltage generating circuit 30 is constructed with multiple MOS transistors M30 and M31 connected in serial, and to each gate of which a common control signal SA can be supplied. In this case, a sum of ON-resistance of the MOS transistors M30 and M31 is equivalent to the ON-resistance Rm30.

A description for FIG. 1 is resumed below. If the divided voltage V1 becomes lower than the reference voltage V2 based on a comparison result between the divided voltage V1 and the reference voltage V2 by the comparator 10, a threshold for the predetermined over current is supposed to be exceeded, then a logic level of the over current detection signal OA provided from the comparator 10 becomes a high level. With respect to the controller 2, if a logic level of the received over current detection signal OA is a high level, logic levels of both the control signals SA and SB are set to a high level to turn OFF the power MOS transistor M10 and M12. In addition, a setting for the threshold of the over current is derived as the equations (3) and (4) as below, based on a relationship that the V1 equals to V2.

$$Rm10 \times IoA/2 = Rm30 \times IA \quad (3)$$

$$IoA = (Rm30/Rm10) \times 2 \times IA \quad (4)$$

To set a desired threshold for the over current, each of an ON-resistance Rm30 of the MOS transistor M30 and ON-resistance Rm10 of the power MOS transistor M10 and a current IA flowing from the constant current source 40 should be adjusted. For example, if Rm30=6[KΩ], Rm10=0.8[Ω], and IA=140 [μA], then a current IoA flowing from the power MOS transistor M10 to the terminal OUT equals to 2.1[A], this value is equivalent to the threshold for the over current. Thus, the comparator 10 determines that the over current exceeds the threshold if the current IoA flowing through the power MOS transistor M10 exceeds 2.1[A].

With respect to the power MOS transistor M12 side, which operate as same as the power MOS transistor M10. In other words, as for the power MOS transistor M12, a logic level supplied from the controller 2 for the NMOS transistor becomes opposite level. And with respect to a circuit construction which detects as the over current when the divided voltage V3 for the low-side side becomes higher than the reference voltage V4, a calculation for the threshold of the over current is same as the power MOS transistor M10 side except setting a logic level for the over current detection signal OB as a high level. Thus, if an ON-resistance of the power MOS transistor M12 is Rm12 and the current supplied from the terminal OUT is IoB, a voltage generated at the power MOS transistor M12 equals to Rm12×IoB. Based on this voltage, the divided voltage V3 is represented as the equation (5) as below, if each ON-resistance of the MOS transistors M24 and M25 is Rm24 and Rm25, and if Rm24≈Rm25.

$$V3 = Rm12 \times IoB/2 \quad (5)$$

Likewise, with respect to the reference voltage V4, the reference voltage V4 is derived as the equation (6) as below, if the ON-resistance of the MOS transistor M34 is Rm34 and a current flowing from the constant current source 44 is IB.

$$V4 = Rm34 \times IB \quad (6)$$

Figure 2B:
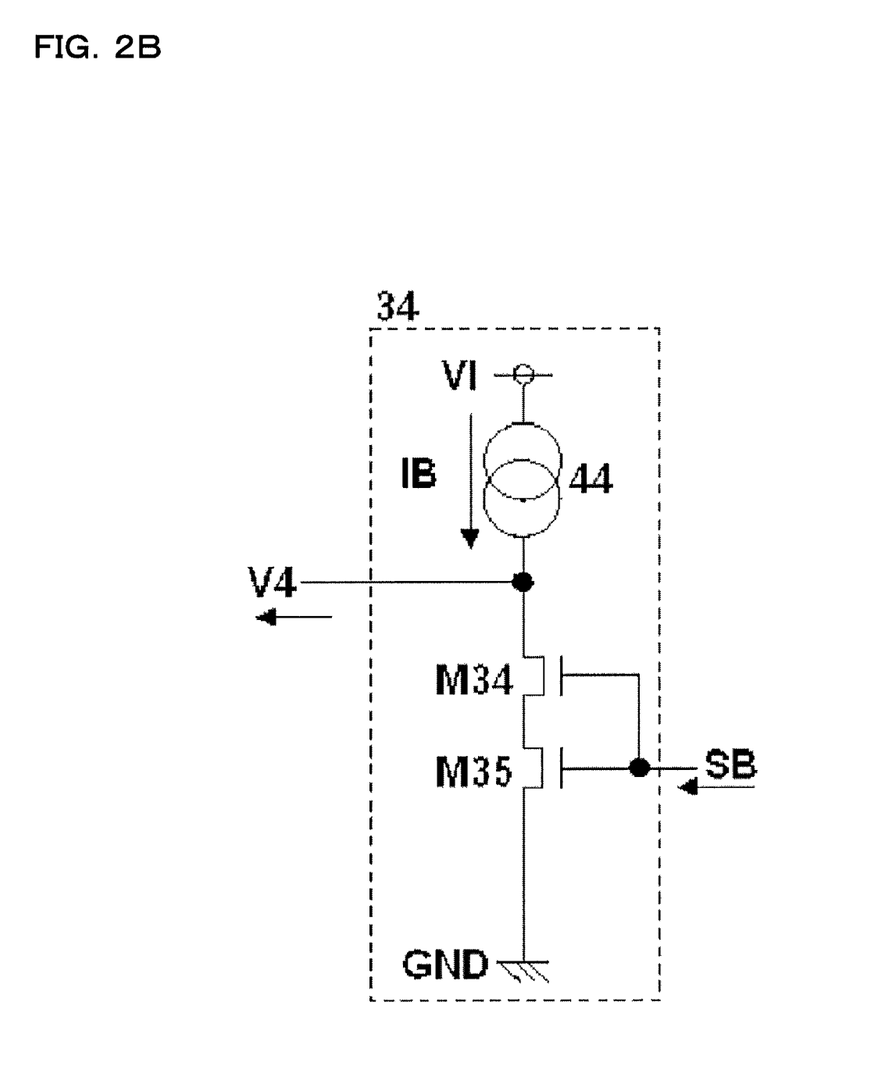
FIG. 2B is a second construction example of the voltage generating circuit of the load driving device in accordance with the disclosure.

FIG. 2B illustrates the voltage generating circuit 34. Different from a construction which uses only one MOS transistor M34 as a method to realize the ON-resistance Rm34 for the voltage generating circuit 34 in accordance with the first implementation, the voltage generating circuit 34 in FIG. 2B includes MOS transistors M34 and M35 connected in series, to gate of the transistors a mutual control signal SB is supplied. In this implementation, a sum of ON-resistances of the MOS transistors M34 and M35 is equivalent to the ON-resistance Rm34.

A description for FIG. 1 is resumed below. A setting for the threshold of the over current is set same as the current IoA, the divided voltage V3 is set as equal to the reference voltage V4. Thus, based on a relation of V3=V4, equations (7) and (8) are derived as below.

$$Rm12 \times IoB/2 = Rm34 \times IB \quad (7)$$

$$IoB = (Rm34/Rm12) \times 2 \times IB \quad (8)$$

To set a threshold of the over current detection to a desired value, ON-resistance Rm34 of the MOS transistor M34, ON-resistance Rm12 of the power MOS transistor M12, and a current IB flowing from the constant current source 44 should be adjusted respectively.

In addition, in case of applying each of the voltage generating circuits 30 and 34 in FIG. 2A and FIG. 2B to the power MOS transistor M10 side and M12 side is explained in above. However, not restricted to this, the voltage generating circuit 30 can be applied to the power MOS transistor M12 side. Likewise, the voltage generating circuit 34 can be applied to the power MOS transistor M10 side.

If providing the voltage generating circuit 30 to the power MOS transistor M12 side, a power source VCC connected to a drain of the transistor M31 can be substituted to an internal power source VI, and the control signal SA provided to each gate of the transistors M31 and M32 can be substituted to the control signal SB. However, a logic level differs if applying the control signal SB as it is, the logic level should be converted by an inverter circuit, and so on. Then the reference voltage V2 is substituted by the reference voltage V4.

If providing the voltage generating circuit 34 to the power MOS transistor M10 side, the internal power source VI connected to the constant current source 44 is substituted to the power source VCC, and the control signal SB provided to each gate of the transistors M34 and M35 substituted to the control signal SA. However, a logic level differs if applying the control signal SA as it is, the logic level should be converted by an inverter circuit, and so on. Then the reference voltage V4 is substituted by the reference voltage V2.

<A Second Implementation>

Figure 3:
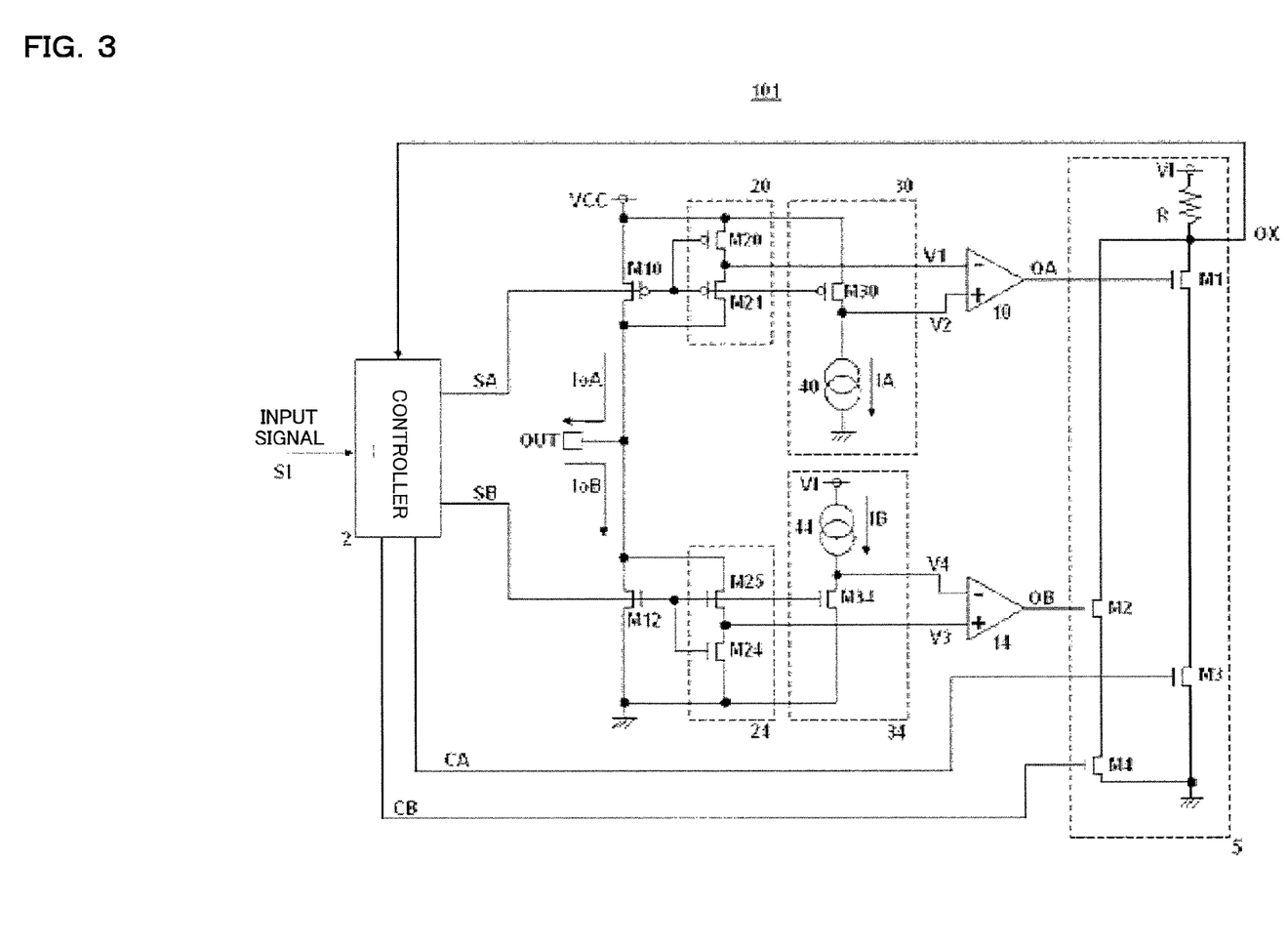
FIG. 3 is a circuit diagram illustrating a second implementation of the load driving device in accordance with the disclosure.

FIG. 3 is a circuit construction illustrating an implementation of the load driving device 101 using the over current protection circuit in accordance with the disclosure. Main changes compared to the first implementation are an addition of a mask circuit 5 and an alternation of a relationship of input/output signal for the controller 2 caused by an addition of the mask circuit 5.

The load driving device 101 includes the controller 2 which provides the control signals SA and SB to each gate of the power MOS transistors M10 and M12 based on the input signal SI. In addition, the controller 2 provides the control signal SA to gates of the MOS transistor M20 and M21 which construct the dividing circuit 20 and to a gate of the MOS transistor M30 which constructs the voltage generating circuit 30. Likewise, the control signal SB is provided to gates of the MOS transistors M24 and M25 which construct the dividing circuit 24 and to a gate of the MOS transistor M34 which constructs the voltage generating circuit 34.

In the dividing circuit 20, each source and drain of the MOS transistor M20 is connected to a source of the power MOS transistor M10 and a source of the MOS transistor M21. Then a drain of the MOS transistor M21 is connected to a drain of the power MOS transistor M10. A voltage potential of a connection node between the MOS transistors M20 and M21 equals to the divided voltage V1. The divided voltage V1 is generated by dividing the voltage across the drain-source of the power MOS transistor M10 with the ON-resistances of the MOS transistors M20 and M21.

Same thing can be applied to the dividing circuit 24 provided to the power MOS transistor M12 side. In other words, the divided voltage V3 generated by dividing a voltage across the drain-source of the power MOS transistor M12 with the MOS transistors M24 and M25 is generated at a connection node between the MOS transistors M24 and M25.

The voltage generating circuit 30 of the load driving device 101 includes the MOS transistor M30 and the constant current source 40 connected to a drain of the MOS transistor M30. This construction generates the reference voltage V2 at a connection node between the MOS transistor M30 and the constant current source 40.

Also with respect to the voltage generating circuit 34 of the power MOS transistor M12 side, the MOS transistor M34 and the constant current source 44 connected to a drain of the MOS transistor M34 are included. This construction generates the reference voltage V4 to a connection node between the MOS transistor M34 and the constant current source 44.

The divided voltage V1 and the reference voltage V2 generated at the power MOS transistor M10 side is inputted to the comparator 10. Thus, the comparator 10 outputs the over current detection signal OA according to the comparison result between the divided voltage V1 and the reference voltage V2. For example, owing to a circuit construction which determines as the over current detection when the divided voltage V1 becomes lower than the reference voltage V2, the logic of the over current detection signal OA can be defined as a high level.

Likewise, with respect to the comparator 14 provided to the power MOS transistor M12 side, the divided voltage V3 and the reference voltage V4 generated at the power MOS transistor M12 side are inputted to the comparator 14. Likewise, the comparator 14 outputs the over current detection signal OB based on a comparison result between the divided voltage V3 and the reference voltage V4. For example, owing to a circuit construction which determines as the over current detection when the divided voltage V3 becomes higher than the reference voltage V4, the logic of the over current detection signal OB can be defined as a high level.

The load driving device 101 includes the mask circuit 5. Based on a normal operation, the over current detection signals OA and OB corresponding to the power MOS transistors M10 and M12 are provided according to a voltage when the power MOS transistors M10 and M12 are turned ON. However, if the power MOS transistor M10 is turned OFF, the divided voltage V1 provided to the comparator 10 becomes unstable. Then there may be a malfunction that a logic level of the over current detection signal OA is provided as a high level which indicates a state of the over current detection. Therefore, when the power MOS transistor M10 is turned OFF, if a signal of a high level which indicates the over current detection is provided from the comparator 10 corresponds to the power MOS transistor M10, the mask circuit 5 has a function not to output the signal to the controller 2. Likewise, with respect to the power MOS transistor M12 side, the mask circuit 5 has a function which does not transmit the over current detection signal OA to the controller 2, even if the over current detection signal OA of a high level is provided from the comparator 14 when the power MOS transistor M12 is turned OFF.

The mask circuit 5 includes the resistor R, the MOS transistor M1, and the MOS transistor M3. The resistor R is connected to the internal power source VI. The drain of the MOS transistor M1 is connected to the resistor R and to a gate of the MOS transistor M1 the over current detection signal OA is inputted. A drain of the MOS transistor M3 is connected to a source of the MOS transistor M1, and to a gate of the MOS transistor M3 the mask signal CA outputted from the controller 2 is inputted. The power MOS transistor M12 side includes the MOS transistor M2 and the MOS transistor M4. A drain of the MOS transistor M2 is connected to the resistor R, and to gate of the MOS transistor M2 the over current detection signal OB is inputted. A drain of the MOS transistor M4 is connected to a source of the MOS transistor M2, and to a gate of the MOS transistor M4 a mask signal CB outputted from the controller 2 is inputted.

An explanation about the mask signals CA and CB in the mask circuit 5 is described below. Each mask signals CA and CB is generated based on the responding control signals SA and SB of the power MOS transistors M10 and M12. To be more concrete, if the control signal SA turns OFF the power MOS transistor M10, the corresponding mask signal CA is a signal which turns OFF the MOS transistor M3. The relationship between the control signal SB and the mask signal CB becomes as same. In addition, each control signals SA and SB and each mask control signals CA and CB are provided from the controller 2, the mask signals CA and CB can be generated by a generating circuit block based on the control signals SA and SB, on behalf of generating the mask signals CA and CB by the controller 2.

Figure 4:
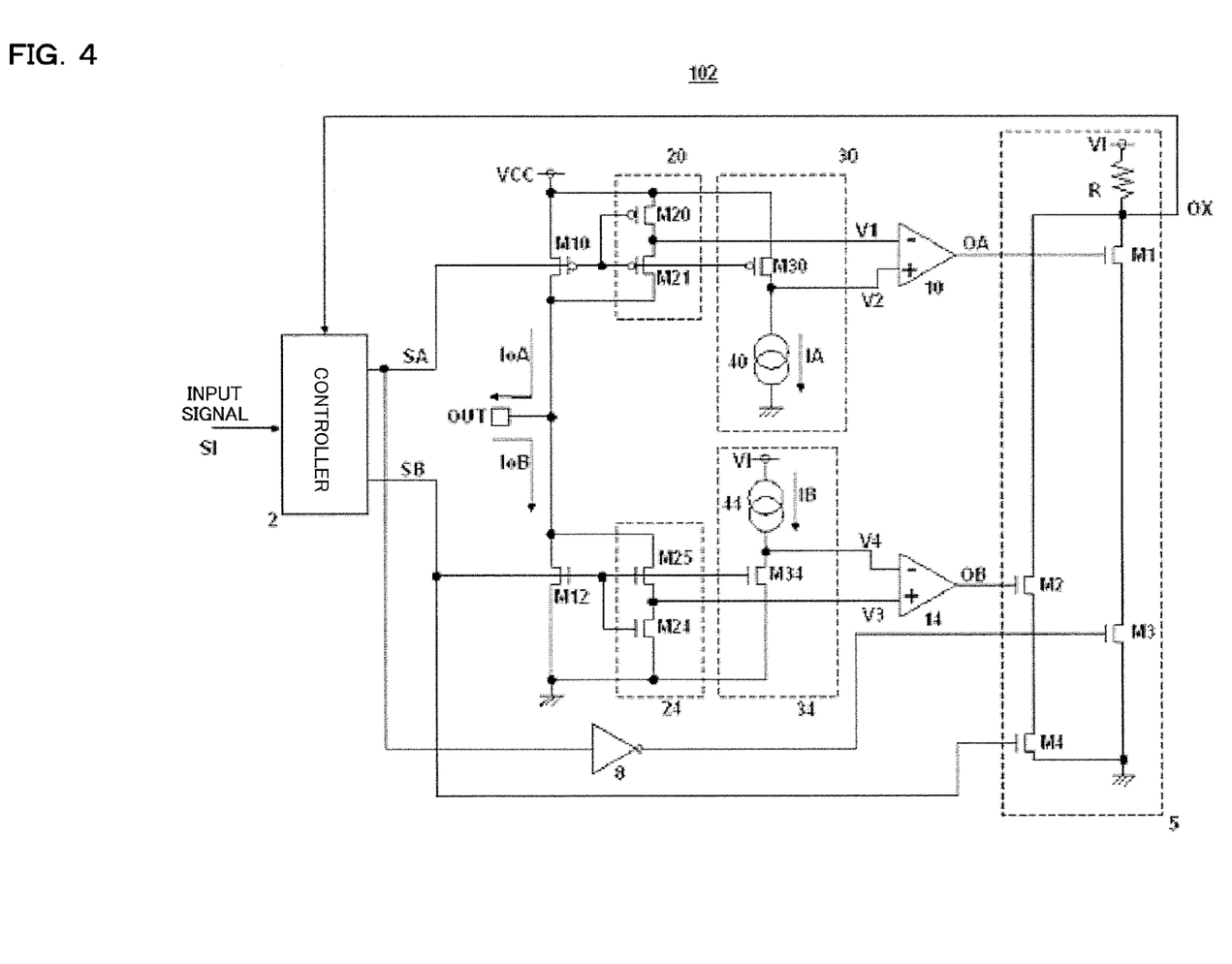
FIG. 4 is a circuit diagram illustrating another construction of the second implementation of the load driving device in accordance with the disclosure.

FIG. 4 is a circuit diagram illustrating another construction of the second implementation. FIG. 4 is illustrating a circuit construction which uses (diverts) the control signals SA and SB as it is as the mask signal. Also, logical inverted control signals SA and SB can be used for the mask signal. For example, with respect to the mask circuit 5 in FIG. 3, because the control signals SB becomes a low level when turns OFF the power MOS transistor M12, the MOS transistor M4 of the mask circuit 5 corresponding to the power MOS transistor M12 operates to be turned OFF, the mask signal CB becomes a low level, too. Thus, logic levels of the mask signal CB and the control signal SB become the same. Thus, the control signal SB can be used as the mask signal CB.

With respect to a construction of the mask circuit 5 in FIG. 3, the control signal SA becomes a high level when turns OFF the power MOS transistor M10, because the MOS transistor M3 of the mask circuit 5 corresponding to the power MOS transistor M10 operates to be turned OFF, the mask signal CA becomes a low level, too. In this case, logic levels of the control signal SA and the mask signal CA are different from each other. Therefore, to generate the mask signal CA from the control signal SA, the inverter circuit 8 which inverts a logic level of the control signal SA illustrated in FIG. 4, should be provided. As the control signal SA is also a signal level to drive the power MOS transistor M10 with high break down voltage, though a high break down voltage element is required as the transistor M3 provided for the mask circuit 5 side if using the control signal SA as it is as the mask signal CA, it is possible to used a transistor with low break down if lowering the signal level of the control signal SA by the level shift circuit.

A description for the FIG. 3 is resumed and a concrete operation of the second implementation is explained as below. However, as for the power MOS transistors M10 and M12, the dividing circuit 20 and 24, and the voltage generating circuit 30 and 34, an explanation is omitted because these are same as the first implementation.

With respect to the power MOS transistor M10 side, when the control signal SA provided from the controller 2 turns ON the power MOS transistor M10, the logic level of the control signal SA becomes a low level. In this case, there is no need to activate the mask function of the mask circuit 5, a logic level of the mask signal CA provided to the mask circuit 5 from the controller 2 becomes a high level.

When the divided voltage V1 inputted to the comparator 10 is higher than the reference voltage V2, if a circuit construction determines the case as the over current no-detection state, a logic level of the outputted over current detection signal OA becomes a low level. Furthermore, the over current detection signal OA is provided to the transistor M1 of the mask circuit 5, the mask signal CA is provided to a gate of the transistor M3. Thus, the transistor M1 becomes OFF state, and the transistor M3 which has the mask function, becomes ON state. Therefore, an output level of the over current detection signal OX becomes a high level. Different from the first implementation, because the controller 2 determines as the over current no-detection when the over current detection signal OX is a high level, there is no affection to generates the control signals SA and SB.

With respect to a circuit construction which determines as an over current detection state if the divided voltage V1 inputted to the comparator 10 becomes lower than the reference voltage V2, a logic level of the outputted over current detection signal OA becomes a high level. Furthermore, the over current detection signal OA is provided to the transistor M1 of the mask circuit 5, then the mask signal CA is provided to a gate of the transistor M3. Thus, the transistor M1 becomes ON state and the transistor M3 which has the mask function becomes ON state. In other words, an output level of the over current detection signal OX becomes a low level, and determines as the over current detection.

An explanation to turn OFF the power MOS transistor M10 is described below. To begin with, if a logic level of the control signal SA provided from the controller 2 is a high level, it is required to activate the mask function of the mask circuit 5, a logic level of the mask signal CA supplied to the mask circuit 5 from the controller 2 becomes a low level.

When turning OFF the power MOS transistor M10, because an operation of the power MOS transistor M10 side is turned OFF, the divided voltage V1 inputted to the comparator 10 becomes unstable, then a logic level of the over current detection signal OA provided from the comparator 10 becomes unstable. Furthermore, the over current detection signal OA is supplied to the transistor M1 of the mask circuit 5, the mask signal CA is supplied to a gate of the transistor M3. Thus, the transistor M1 becomes an unstable state that the ON/OFF state is not stable, then the transistor M3 which has the mask function becomes OFF state.

In short, if the transistor M3 is OFF state, a voltage potential level of the drain of the transistor M1 is maintained as a high level, regardless of an output level of the over current detection signal OA.

In the mask circuit 5, a drain of the transistor M1 is connected to a drain of the transistor M2 which corresponds to the power MOS transistor M12 side. Thus, finally, an output level of the over current detection signal OX provided from the mask circuit 5 is determined including an operation of the power MOS transistor M12 side. However, it is not affected by an output level of the over current detection signal OA.

An explanation for the power MOS transistor M12 side is described as below when the power MOS transistor M10 is OFF state. Because the circuit operation is similar to the power MOS transistor M10 side, a detailed explanation is omitted here. When the power MOS transistor M10 is OFF state, if the power MOS transistor M12 is turned ON, the transistor M4 of the mask circuit 5 becomes ON state. Then, with respect to a circuit construction which determines as the over current no-detection state, when a logic level of the over current detection signal OB outputted from the comparator 14 provided for the power MOS transistor M12 side is a low level, a voltage potential of a drain of the transistor M2 becomes the voltage potential VI, or a high level in short. Thus, the over current detection signal OX provided from the mask circuit 5 becomes a high level. In addition, both of the power MOS transistors M10 and M12 can be operated to be OFF state, too.

If a logic level of the over current detection signal OB provided from the comparator 14 is a high level which indicates the over current state, a voltage potential of a drain of the transistor M2 becomes a low level. In this case, the over current detection signal OX provided from the mask circuit 5 becomes a low level because each drain of the transistors M1 and M2 becomes a low level. Therefore, as the controller 2 determines the output as an over current detection, the controls signals SA and SB are controlled to turn OFF the power MOS transistors M10 and M12.

Thus, the over current detection signal OX can be generated based on the turned ON power MOS transistor side without an affection of an incorrect operation of the turned OFF power MOS transistor side with the function of the mask circuit 5.

Figure 5:
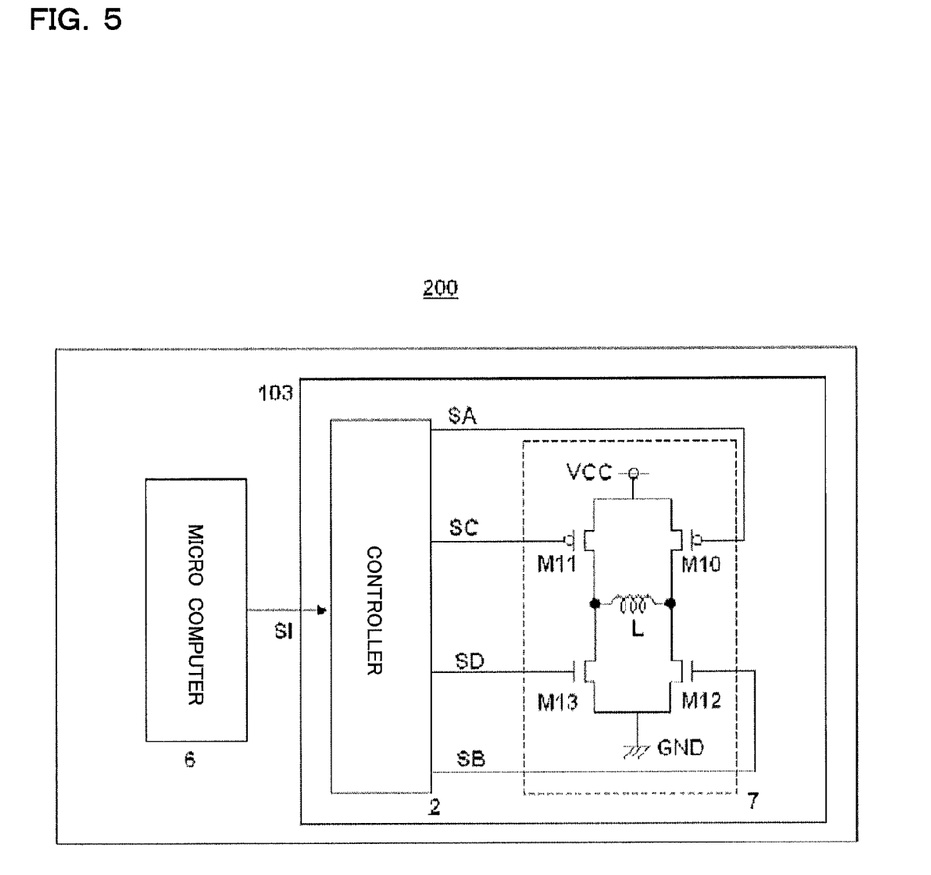
FIG. 5 is a circuit diagram illustrating an electrical apparatus in accordance with the disclosure.
Figure 6:
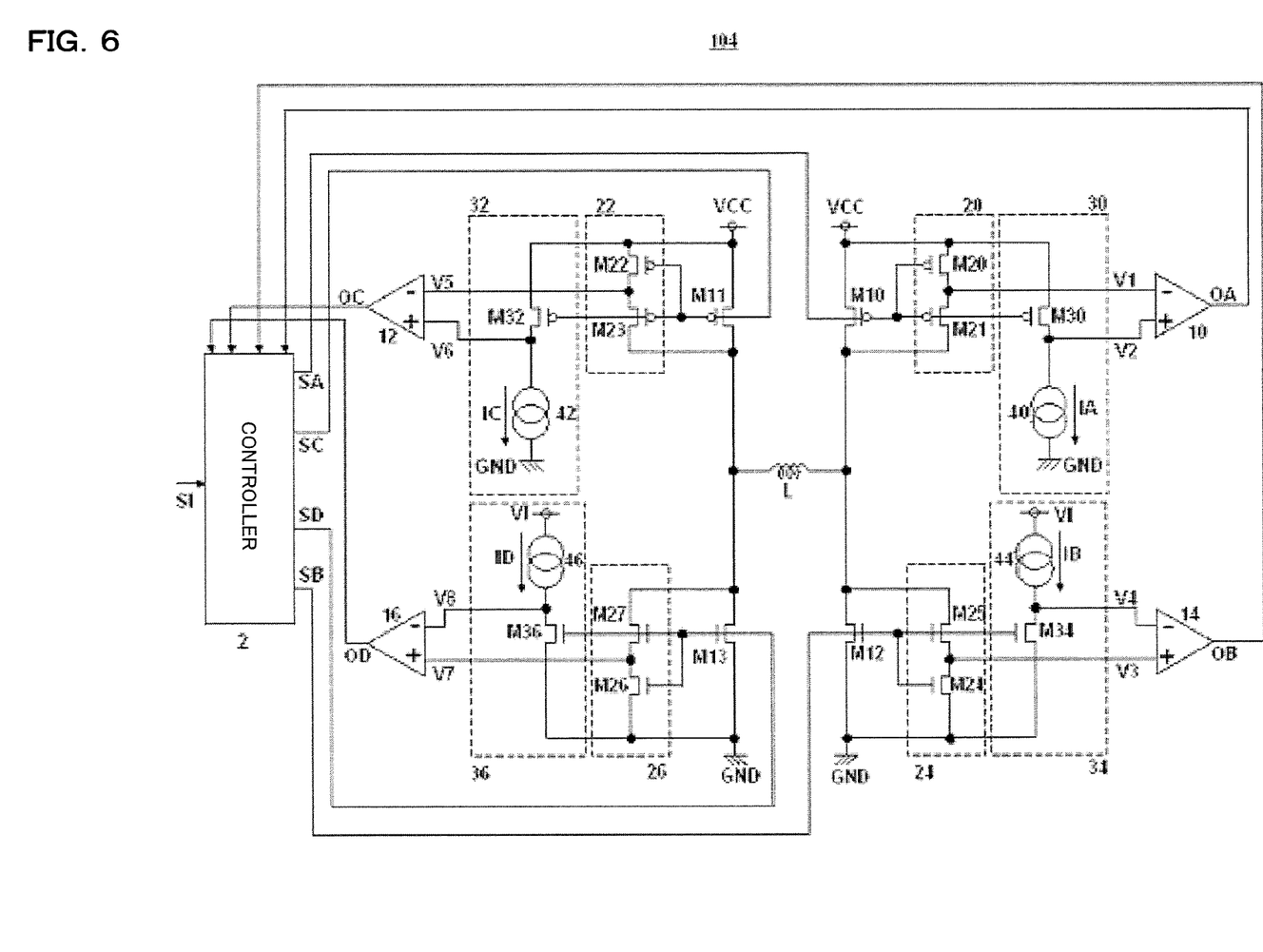
FIG. 6 is a first construction example illustrating the electrical apparatus using the load driving device in accordance with the disclosure.
Figure 7:
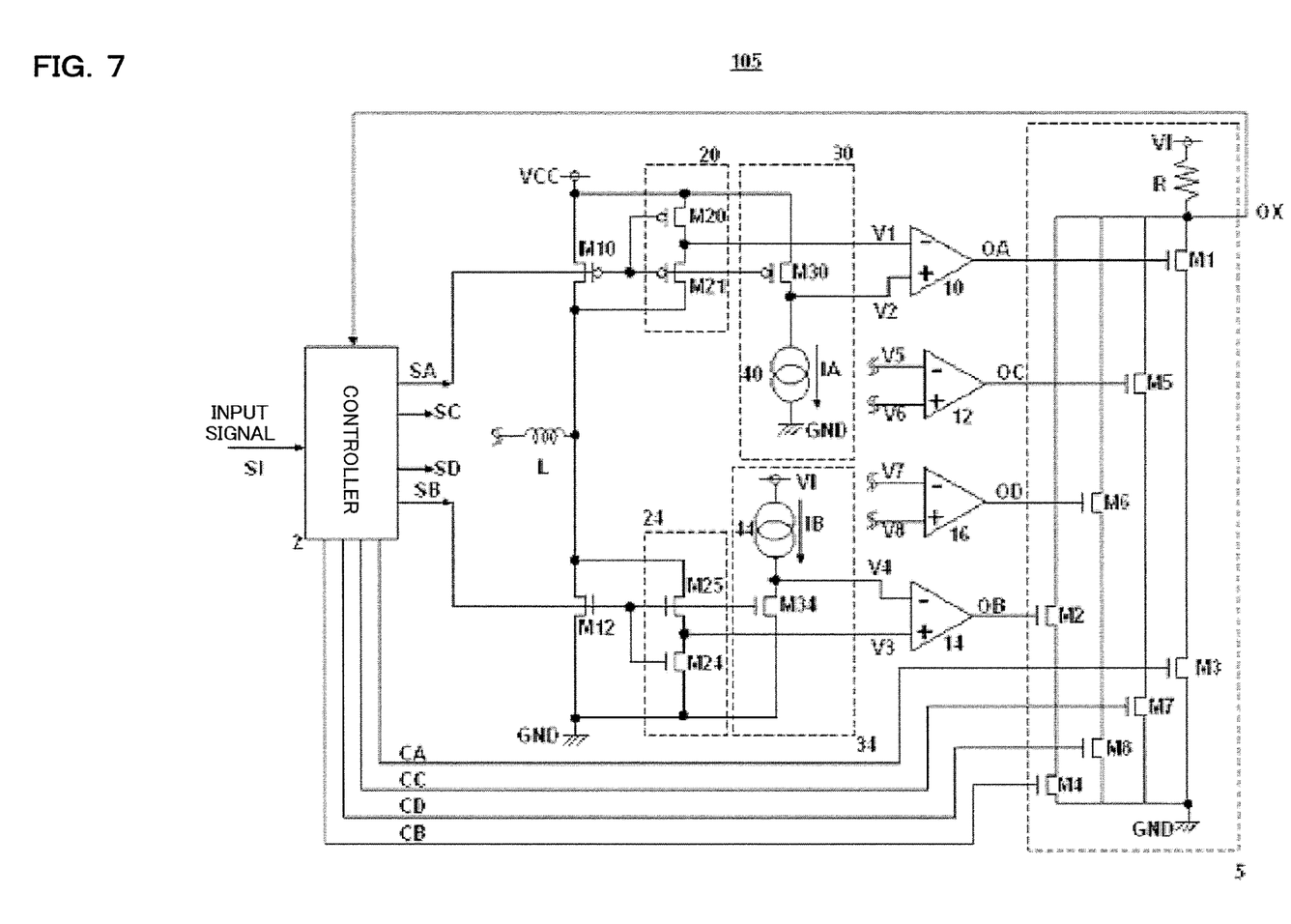
FIG. 7 is a second construction example illustrating the electrical apparatus using the load driving device in accordance with the disclosure.

In reference to FIG. 5 to FIG. 7, a construction is described as below which indicates an electrical apparatus in accordance with the disclosure and an electrical apparatus using the load driving device in accordance with the disclosure. FIG. 5 is an electrical apparatus in accordance with the disclosure, and FIG. 6 and FIG. 7 are diagrams each of which indicates the first construction example and second construction example using the load driving device in accordance with the disclosure to the electrical apparatus.

The electrical apparatus 200 illustrated in FIG. 5 includes a microcomputer 6 which generates the input signal SI, and the load driving device 103 which is controlled according to the input signal SI. The load driving device 103 further includes a motor coil L, a H bridge circuit 7 including the power MOS transistors M10 to M13 each of which is equivalent to an output transistor to drive a motor coil L, and the controller 2 to generate the control signals SA to SD for controlling the power MOS transistors M10 to M13 according to the input signal SI.

As operating states of the H bridge circuit 7, there are two operating states. With respect to the power MOS transistors M10 to M13 constructing the H bridge circuit 7, the power MOS transistors M11 and M12 are turned ON, and the power MOS transistors M10 and M13 are turned OFF as the first operation state. The power MOS transistors M11 and M12 are turned OFF, and the power MOS transistors M10 and M13 are turned ON as the second operation state.

For example, in case of driving a coil current by the load driving device 103 for each phases of a stepping motor, the first operation state and the second operation state are switched alternatively every time stepping pulses (not illustrated) are provided during a rotation of the motor. On the other hand, during the motor hold period (i.e., during a stepping pulse is not generated), the H bridge circuit 7 is maintained as either one of the first operation state and the second operation state.

In case of driving a coil current for a DC brushed motor, if the motor is driven to the first rotation direction (e.g., positive rotation direction), the H bridge circuit 7 is maintained as the first operation state. On the other hand, if the motor is driven to the second direction (e.g., the reverse direction) opposite to the first direction, the H bridge circuit 7 is maintained as the second operation state.

The motor coil L is a load driven and controlled by the load driving device 103. As aforementioned, the motor driving device 103 including the H bridge circuit 7 can be used for a driving method to drive the stepping motor and the DC brushed motor. In addition, if the electrical apparatus 200 is a door mirror of a car, the motor driving device 103 can be used to adjust an angle of the door mirror. If the electrical apparatus 200 is an air conditioner, the motor driving device 103 can be applied to drive a dumper for switching an outside air and inside air, a temperature control, and adjusting ventilation duct.

The microcomputer 6 generates the input signal SI for the controller 2. For example, the input signal SI is generated according tot a rotation number of the motor.

The first construction example using the load driving device 104 illustrated in FIG. 6 as the electrical apparatus indicates a condition where the load driving device 104 is applied for the electrical apparatus 200 in FIG. 5. This construction is a construction which equals to the first implementation of the aforementioned load driving device 100 approximately. To apply this construction to the H bridge circuit, two pairs of the first implementations of the motor driving device 100 are used and the motor coil L is connected between each of the output terminals OUT. Two pairs of the first implementations of the motor driving device 100 are connected to the controller 2 mutually. Thus, the controller 2 generates the control signals SA to SD to control the power MOS transistors M10 to M13 according to the input signal SI. The over current detection signals OA to OD provided from each of the comparators 10, 12, 14, and 16 are provided to the controller 2. If either one of the over detection signals OA to OD is a signal which indicates the over current detection, the controller 2 stops generating the control signals SA to SD regardless of the input signal SI.

As an operation to detect the over current for the power MOS transistors M11 and M13 is the same operation for the power MOS transistors M10 and M12, a detailed explanation is omitted.

The second construction example using the load driving device 105 illustrated in FIG. 7 as the electrical apparatus indicates a condition where the load driving device 105 is applied for the electrical apparatus 200 in FIG. 5. Except for addition of the mask circuit 5, this construction is almost equal to the construction illustrated in FIG. 6. In other words, this construction is a construction which equals to the second implementation of the aforementioned load driving device 100 approximately. To apply this construction to the H bridge circuit, two pairs of the second implementations of the motor driving device 100 are used and the motor coil L is connected between each of the output terminals OUT. The two pairs of the second implementations of the motor driving 100 are connected to the controller 2 mutually. Thus, the controller 2 generates the control signals SA to SD to control the power MOS transistors M10 to M13 according to the input signal SI. The over current detection signals OA to OD provided from each of the comparators 10, 12, 14, and 16 and the mask signals CA to CD are provided to the mask circuit 5. The mask circuit 5 outputs the over current detection signal OX according to each of the over current detection signals OA to OD and each of the mask signals CA to CD. Then, if the over current detection signal OX is a signal which indicates the over current protection, the controller 2 stops generating the control signals SA to SD regardless of the input signal SI.

As an operation to detect the over current for the power MOS transistors M11 and M13 side, and an operation of the opposing mask signals CC and CD are the same operation for the power MOS transistors M10 and M12, a detailed explanation is omitted.

The mask circuit 5 related to the power MOS transistor M11 and M13 are almost same. A detailed construction is explained. The mask circuit 5 includes a resistor R connected to an internal power source VI. A construction related to the power MOS transistors M10 and M12 side includes the transistor M1 having a drain connected the resistor R and to the gate of which the over current detection signal OA is provided, the transistor M3 having a drain connected to a source of the transistor M1 and to the gate of which the mask signal CA is provided, the transistor M2 having a drain connected to the resistor R and to the gate of which the over current detection signal OB is provided, and the resistor M4 having a drain connected to a source of the transistor M2 and to the gate of which the mask signal CB is provided. Then, as a construction related to the power MOS transistors M11 and M13 side includes the transistor M5 having a drain connected to the resistor R and to the gate of which the over current detection signal OC is provided, the transistor M7 having a drain connected to a source of the transistor M5 and to the gate of which the mask signal CC is provided, the transistor M6 having a drain connected to the resistor R and to the gate of which the over current detection signal OD is provided, and the transistor M8 having a drain connected to a source of the transistor M6 and to the gate of which the mask signal CD is provided. For example, if the over current detection signal of a high level is provided to either one of the transistors M1, M2, M5, and M6, and if the mask transistor connected to a source of the transistors is ON state, then drain potential voltages of the transistors M1, M2, M5, and M6 become ground potential voltage GND. Thus, a logic level of the over current detection signal OX becomes a low level (it is a logical level when a over current is detected), the controller 2 stop generating the control signal according to the over current detection signal OX.

<Overview>

Technical features disclosed in this specification are overviewed generally as below.

To resolve the aforementioned problem, a load driving device of the first construction including a controller to generate a first control signal based on an input signal, a first output transistor to supply an output current to a load according to the first control signal, a first dividing circuit to output a first divided voltage by dividing a voltage across a first primary electrode and second primary electrode of the first output transistor by a first transistor and a second transistor connected in series, a first voltage generating circuit to output a first reference voltage, and a first comparator to supply a first over current detection signal to the controller based on the first reference voltage and the first divided voltage.

As a second construction according to the load driving device of the first construction, wherein the first voltage generating circuit is constructed with a third transistor and a first constant current source, the first reference voltage is provided from a connection node between the third transistor and the first constant current source.

As a third construction according to the load driving device of the first construction, wherein the first dividing circuit outputs the first divided voltage from the connection node between the first transistor and the second transistor, based on ON-resistances of the first transistor and the second transistor.

Owing to either one construction from first to third, a detection resistance is not required for the load driving device. Therefore, a shrink of a circuit scale and an improvement of the electrical power efficiency can be realized.

As a fourth construction according to the load driving device of the second construction, wherein the controller supplies the first control signal to the first transistor, the second transistor, and the third transistor.

As a fifth construction according to either one of the constructions of the load driving device from the first to the fourth, wherein the controller turns the first control signal to a signal which turns OFF the first output transistor, regardless of the input signal if the first over current detection signal is a signal which indicates the over current detection.

As a sixth construction according to the load driving device of the first construction, further including a second output transistor connected with the first output transistor in series and supplies an output current to the load based on a second control signal, a second dividing circuit to output a second divided voltage by dividing a voltage across a first primary electrode of and a second primary electrode of the second output transistor by a fourth transistor and a fifth transistor connected in series, a second voltage generating circuit to output a second reference voltage, and a second comparator to supply a second over current detection signal to the controller based on the second reference voltage and the second divided voltage.

Owing to the sixth construction, even if output transistors are required for the high side and low side, each voltage across drain-source of the output transistors can be monitored, therefore an incorrect operation can be reduced compared to a circuit construction monitoring an output voltage of the output transistor.

As a seventh construction according to the load driving device of the sixth construction, wherein the second voltage generating circuit is constructed with a sixth transistor and a second constant current source, the second reference voltage is provided from a connection node between the sixth transistor and the second constant current source.

As a eighth construction according to the load driving device of the sixth construction, wherein the second dividing circuit outputs the second divided voltage from a connection node between the fourth transistor and the fifth transistor based on ON-resistances of the fourth transistor and the fifth transistor.

As a ninth construction according to the load driving device of the seventh construction, wherein the controller supplies the second control signal to the fourth transistor, the fifth transistor, and the sixth transistor.

As a tenth construction according to either one of the constructions of the load driving device from the sixth to the ninth, wherein the controller turns the second control signal to a signal which turns OFF the second output transistor, regardless of the input signal if the second over current detection signal is a signal which indicates the over current detection.

A load driving device of the eleventh construction in accordance with the disclosure including a controller to generate a first control signal based on an input signal, a first output transistor to supply an output current to a load according to the first control signal, a first dividing circuit to output a first divided voltage by dividing a voltage across a first primary electrode and second primary electrode of the first output transistor by a first transistor and a second transistor connected in series, a first voltage generating circuit to output a first reference voltage, a first comparator to supply a first over current detection signal to the controller based on the first reference voltage and the first divided voltage, and a mask circuit to determine a third over current detection signal provided to the controller, regardless of the first over current detection signal if a first mask signal is effective.

As twelfth construction according to the load driving device of the eleventh construction, wherein the mask circuit includes a resistor, a third transistor connected with the resistor and to which the first over current detection signal is provided, and a fourth transistor to which the first mask signal is provided and connected with the third transistor. The mask circuit outputs a third over current detection signal from a connection node between the resistor and the third transistor.

As thirteenth construction according to the load driving device of the twelfth construction, further including a second output transistor connected with the first output transistor in series and supplies an output current to the load based on a second control signal, a second dividing circuit to output a second divided voltage by dividing a voltage across a first primary electrode of and a second primary electrode of the second output transistor by a fifth transistor and a sixth transistor connected in series, a second voltage generating circuit to output a second reference voltage, and a second comparator to supply a second over current detection signal to the mask circuit based on the second reference voltage and the second divided voltage.

Owing to either one construction from eleventh to thirteenth, a detection resistance is not required for the load driving device. Therefore, a shrink of a circuit scale and an improvement of the electrical power efficiency can be realized. Furthermore, the reliability can be improved by having the mask circuit.

As fourteenth construction according to the load driving device of the thirteenth construction, wherein the mask circuit includes a seventh transistor connected with the resistor and to which the second over current detection signal is provided, and a eighth transistor connected with the seventh transistor and to which a second mask signal is provided. The mask circuit determines the third over current detection signal provided to the controller based on over current detection signals except an over current detection signal which corresponds an effective mask signal among the first mask signal and the second mask signal.

The fifteenth construction of the disclosure is related to an electrical apparatus including a load, a load driving device to perform driving control of the load in the sixth construction, a microcomputer to generate an input signal for controlling the load driving device.

As sixteenth construction according to the electrical apparatus of the fifteenth construction, further including a mask circuit to which an over current detection signal and a mask signal are provided, wherein the over current detection signal is provided from the load driving device and the mask signal is provided from the controller.

<Effect>

With respect to the load driving device and the electrical apparatus using this, without using the detection resistor, the divided voltage across the drain-source of the output transistor (i.e., power MOS transistor) can be generated and detecting the over current based on the divided voltage. Therefore, even in a circumstance where a shrink of the circuit scale is required or a circumstance using a high voltage, it can be implemented with an easy construction comparatively. Furthermore, based on a control by the mask circuit for the comparator provided for the current over detection, it can be implanted not to be affected by undesired over current detection based on an incorrect operation of the comparator, a reliability can be improved for the over current detection.

<Industrial Applicability>

For example, the load driving device in accordance with the disclosure can be used to improve reliability and the security for an electrical apparatus using the load driving device. Therefore, the load driving device has a high industrial applicability.

<Other Implementations>

For example, though the MOS transistor is used to explain the disclosure, the bipolar transistor can be used. As for the MOS transistor, the drain is used as the first primary electrode, the source is used as the second primary electrode, and the gate is used as the control electrode. In case of using the bipolar transistor, as for the bipolar transistor, the collector is used as the first primary electrode, the emitter is used as the second primary electrode, and the base is used as the control electrode. As for the logic level of the over current detection signal provided from the comparator, it is set as a high level when the over current is detected, it can be set as a low level when the over current is detected. With respect to the logic level of the mask circuit, the logic level can be set as long as the mask function operates.

In addition, though a best mode of the disclosure is explained in the above, various modifications can be made to the disclosure, and it is obvious for the person having ordinary skill to implement several implementations different from the aforementioned implementation. Therefore, it is understood that any variations within the scope of the claims and equivalents should be included to the scope of the technical scope of the disclosure without departing from the spirit and the scope of the disclosure.

LIST OF REFERENCE NUMERALS 2 controller
5 mask circuit
6 microcomputer
7 H bridge circuit
8 inverter
10, 12, 14, 16 comparator
20, 22, 24, 26 dividing circuit
30, 32, 34, 36 voltage generating circuit
40, 42, 44, 46 current source
100, 101, 102, 103, 104, 105 load driving device
200 electrical apparatus
CA, CB, CC, CD mask signal
L motor coil(load)
M1 to M8 NMOS transistor
M10, M11 power PMOS transistor
M12, M13 power NMOS transistor
M20, M21, M22, M23 PMOS transistor
M24, M25, M26, M27 NMOS transistor
M30, M31, M32 PMOS transistor
M34, M35, M36 NMOS transistor
OUTPUT output terminal
R resister
SA, SB, SC, SD control signal
SI input signal

What is claimed is:

1. A load driving device comprising:
a controller to generate a first control signal based on an input signal;
a first output transistor to supply an output current to a load according to the first control signal;
a first dividing circuit to output a first divided voltage by dividing a voltage across a first primary electrode and a second primary electrode of the first output transistor by a first transistor and a second transistor connected in series;
a first voltage generating circuit to output a first reference voltage, wherein the first voltage generating circuit includes a third transistor and a first constant current source, wherein the first reference voltage is provided from a connection node between the third transistor and the first constant current source, and wherein the controller supplies the first control signal to the first transistor, the second transistor, and the third transistor; and
a first comparator to supply a first over current detection signal to the controller based on the first reference voltage and the first divided voltage,
wherein the first dividing circuit outputs the first divided voltage from a connection node between the first transistor and the second transistor.

2. The load driving device according to claim 1, wherein the controller turns the first control signal to a signal which turns OFF the first output transistor, regardless of the input signal if the first over current detection signal is a signal which indicates the over current detection.

3. The load driving device according to claim 1 comprising:
a second output transistor connected with the first output transistor in series and supplies an output current to the load based on a second control signal;
a second dividing circuit to output a second divided voltage by dividing a voltage across a first primary electrode of and a second primary electrode of the second output transistor by a fourth transistor and a fifth transistor connected in series;
a second voltage generating circuit to output a second reference voltage; and
a second comparator to supply a second over current detection signal to the controller based on the second reference voltage and the second divided voltage.

4. The load driving device according to claim 3, wherein the second voltage generating circuit is constructed with a sixth transistor and a second constant current source, and wherein the second reference voltage is provided from a connection node between the sixth transistor and the second constant current source.

5. The load driving device according to claim 3, wherein the second dividing circuit outputs the second divided voltage from a connection node between the fourth transistor and the fifth transistor based on ON-resistances of the fourth transistor and the fifth transistor.

6. The load driving device according to claim 4, wherein the controller supplies the second control signal to the fourth transistor, the fifth transistor, and the sixth transistor.

7. The load driving device according to claim 3, wherein the controller turns the second control signal to a signal which turns OFF the second output transistor, regardless of the input signal if the second over current detection signal is a signal which indicates the over current detection.

8. A load driving device comprising:
a controller to generate a first control signal based on an input signal;
a first output transistor to supply an output current to a load according to the first control signal;
a first dividing circuit to output a first divided voltage by dividing a voltage across a first primary electrode and second primary electrode of the first output transistor by a first transistor and a second transistor connected in series;
a first voltage generating circuit to output a first reference voltage, wherein the first voltage generating circuit includes a third transistor and a first constant current source, wherein the first reference voltage is provided from a connection node between the third transistor and the first constant current source, and wherein the controller supplies the first control signal to the first transistor, the second transistor, and the third transistor;
a first comparator to supply a first over current detection signal to the controller based on the first reference voltage and the first divided voltage; and
a mask circuit to determine a second over current detection signal provided to the controller, regardless of the first over current detection signal if a first mask signal is effective,
wherein the first dividing circuit outputs the first divided voltage from a connection node between the first transistor and the second transistor.

9. The load driving device according to claim 8, wherein the mask circuit comprises:
a resistor;
a third transistor connected with the resistor and to which the first over current detection signal is provided; and a fourth transistor to which the first mask signal is provided and connected with the third transistor;

wherein the mask circuit outputs a second over current detection signal from a connection node between the resistor and the third transistor.

10. The load driving device according to claim 9 comprising:
- a second output transistor connected with the first output transistor in series and supplies an output current to the load based on a second control signal;
- a second dividing circuit to output a second divided voltage by dividing a voltage across a first primary electrode of and a second primary electrode of the second output transistor by a fifth transistor and a sixth transistor connected in series;
- a second voltage generating circuit to output a second reference voltage; and
- a second comparator to supply a third over current detection signal to the mask circuit based on the second reference voltage and the second divided voltage.

11. The load driving device according to claim 10, wherein the mask circuit comprises:
- a seventh transistor connected with the resistor and to which the third over current detection signal is provided; and
- a eighth transistor connected with the seventh transistor and to which a second mask signal is provided;
- wherein the mask circuit determines the third over current detection signal provided to the controller based on over current detection signals except an over current detection signal which corresponds an effective mask signal among the first mask signal and the second mask signal.

12. An electrical apparatus comprising:
a load;
a load driving device in accordance with claim 1 to perform driving control of the load; and
a microcomputer to generate an input signal for controlling the load driving device.

13. The electrical apparatus according to claim 12 comprising:
- a mask circuit to which an over current detection signal and a mask signal are provided, wherein the over current detection signal is provided from the load driving device and the mask signal is provided from the controller.

14. An electrical apparatus comprising:
a load;
a load driving device in accordance with claim 2 to perform driving control of the load; and
a microcomputer to generate an input signal for controlling the load driving device.

15. An electrical apparatus comprising:
a load;
a load driving device in accordance with claim 3 to perform driving control of the load; and
a microcomputer to generate an input signal for controlling the load driving device.

16. An electrical apparatus comprising:
a load;
a load driving device in accordance with claim 4 to perform driving control of the load; and
a microcomputer to generate an input signal for controlling the load driving device.

17. An electrical apparatus comprising:
a load;
a load driving device in accordance with claim 5 to perform driving control of the load; and
a microcomputer to generate an input signal for controlling the load driving device.

18. An electrical apparatus comprising:
a load;
a load driving device in accordance with claim 6 to perform driving control of the load; and
a microcomputer to generate an input signal for controlling the load driving device.

19. An electrical apparatus comprising:
a load;
a load driving device in accordance with claim 8 to perform driving control of the load; and
a microcomputer to generate an input signal for controlling the load driving device.

20. An electrical apparatus comprising:
a load;
a load driving device in accordance with claim 9 to perform driving control of the load; and
a microcomputer to generate an input signal for controlling the load driving device.

* * * * *